United States Patent
Sandhu

(10) Patent No.: US 7,271,096 B2
(45) Date of Patent: Sep. 18, 2007

(54) METHOD FOR IMPROVED DEPOSITION OF DIELECTRIC MATERIAL

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/004,702

(22) Filed: Dec. 3, 2004

(65) Prior Publication Data

US 2005/0098108 A1 May 12, 2005

Related U.S. Application Data

(62) Division of application No. 09/649,897, filed on Aug. 28, 2000, now Pat. No. 6,896,737.

(51) Int. Cl.
*H01L 21/30* (2006.01)
(52) U.S. Cl. .................. 438/680; 438/758; 438/800; 257/E21.002
(58) Field of Classification Search ................ 438/680, 438/758, 800; 118/715; 156/345.33
See application file for complete search history.

(56) References Cited

U.S. PATENT DOCUMENTS

| | | |
|---|---|---|
| 4,980,204 A | 12/1990 | Fujii et al. |
| 5,270,264 A | 12/1993 | Andideh et al. |
| 5,431,738 A | 7/1995 | Murakami et al. |
| 5,872,058 A | 2/1999 | Van Cleemput et al. |
| 6,030,881 A | 2/2000 | Papasouliotis et al. |
| 6,113,700 A * | 9/2000 | Choi .......................... 118/715 |
| 6,206,972 B1 * | 3/2001 | Dunham ..................... 118/715 |
| 6,217,937 B1 | 4/2001 | Shealy |
| 6,328,803 B2 | 12/2001 | Rolfson et al. |
| 6,872,259 B2 * | 3/2005 | Strang ........................ 118/715 |

FOREIGN PATENT DOCUMENTS

| | | |
|---|---|---|
| JP | 05036730 A | 2/1993 |
| JP | 07240375 A | 9/1995 |
| WO | WO 200175188 A2 | 10/2001 |

OTHER PUBLICATIONS

General Atomics; *Fast Gas Injection System*; wysiwyg://23/http://fusion.gat.com/products/controls/Gasinjector/; printed Jun. 27, 2000 4:40 p.m.; 2 pages.

Maxtek, Inc., *MV-112, Piezoelectric Valve*; http://www.maxtekinc.com/mv-112.htm; printed Jun. 27, 2000 4:40 p.m.; 2 pages.

* cited by examiner

*Primary Examiner*—Alexander Ghyka
(74) *Attorney, Agent, or Firm*—TraskBritt, PC

(57) ABSTRACT

A gas delivery device useful in material deposition processes executed during semiconductor device fabrication in a reaction chamber, including the gas delivery device of the present invention and a method for carrying out a material deposition process, including introducing process gas into a reaction chamber using the gas delivery device of the present invention. In each embodiment, the gas delivery device of the present invention includes a plurality of active diffusers and a plurality of gas delivery nozzles, which extend into the reaction chamber. Before entering the reaction chamber through one of the plurality of gas delivery nozzles, process gas must first pass through one of the plurality active diffusers. Each of the active diffusers is centrally controllable such that the rate at which process gas flows through each active diffuser is exactly controlled at all times throughout a given deposition process.

6 Claims, 11 Drawing Sheets

METHOD FOR IMPROVED DEPOSITION OF DIELECTRIC MATERIAL

CROSS-REFERENCE TO RELATED APPLICATION

This application is a divisional of application Ser. No. 09/649,897, filed Aug. 28, 2000, now U.S. Pat. No. 6,896,737, issued May 24, 2005.

BACKGROUND OF THE INVENTION

1. Field of the Invention

The present invention relates to reaction chambers used for the deposition of material layers during fabrication of semiconductor devices. Specifically, the present invention relates to an improved gas delivery device for improved control of chemical vapor delivery within a semiconductor device fabrication chamber.

2. State of the Art

As is well known, processes for semiconductor device fabrication generally involve the deposition and processing of one or more material layers on a semiconductor substrate. Often, these different material layers are formed using well-known chemical vapor deposition (CVD) processes, such as thermally enhanced (TE) CVD, plasma enhanced (PE) CVD or high density plasma (HDP) CVD. Such techniques require placing a semiconductor substrate within a sealed reaction chamber and introducing one or more chemical vapors into the sealed reaction chamber under conditions known to result in the deposition of a desired material. However, in order to ensure the deposition of high-quality material layers using known deposition techniques, the quantity and quality of the gaseous chemicals entering the sealed reaction chamber must be carefully controlled throughout the deposition process. Failure to control the amount of chemical vapor entering a reaction chamber, the distribution of chemical vapor within the reaction chamber, or the rate at which a given amount of chemical vapor enters the reaction chamber can each result in low-quality material layers that substantially compromise the quality of the subsequently completed semiconductor device.

For example, HDP CVD processes are often used to fill various features, such as isolation gaps or trenches, included in an intermediate semiconductor device structure with a dielectric material, such as silicon dioxide ($SiO_2$). HDP CVD processes are currently favored for filling isolation gaps or trenches because the simultaneous dielectric deposition and sputter etch produced by such processes allows small, high-aspect ratio features to be reliably filled with dielectric material. However, imprecise control of the reactant gases used for HDP deposition will either result in damage to underlying device features or deposition of a low-quality dielectric layer, either of which significantly reduces the performance and reliability of subsequently completed semiconductor devices.

Presently used HDP CVD processes often utilize a gas mixture containing oxygen ($O_2$), silane ($SiH_4$), and inert gases, such as argon (Ar), in combination with plasma generation and application of an RF bias to the target substrate, to achieve simultaneous dielectric deposition and sputter etching. The interaction of $SiH_4$ and $O_2$ molecules in the HDP environment results in the deposition of silicon dioxide ($SiO_2$) over the semiconductor substrate. However, as $SiO_2$ is deposited over the semiconductor substrate, molecules of the inert gas included in the gas mixture are ionized by the plasma produced within the chamber. Due to the RF bias applied to the semiconductor substrate, the ionized molecules accelerate toward and impinge upon the surface of the substrate. As a result, $SiO_2$ is simultaneously deposited on the wafer surface and sputter etched by accelerated ionized particles. In most HDP CVD processes, the ratio of deposition rate to etch rate ranges from about 2% to about 20%. It is the simultaneous deposition and sputter etch created by HDP CVD processes that allow higher aspect ratio features to be filled with the desired dielectric material.

In order to better describe the simultaneous deposition and sputter etch of a typical HDP CVD process, drawing FIG. 1 through 4 schematically illustrate various stages of such a process. Illustrated in drawing FIG. 1 is an intermediate semiconductor device 5 including a semiconductor substrate 10 with an isolation gap 12 disposed between two circuit elements 14. As can be seen in drawing FIG. 1, due to the interaction of $SiH_4$ with $O_2$ during a typical HDP CVD process, a layer of $SiO_2$ 16 begins to form over the two circuit elements 14 and within the isolation gap 12. As the $SiO_2$ 16 is deposited, however, charged ions (not shown in drawing FIG. 1) impinge on and sputter etch the newly deposited layer of $SiO_2$ 16. Because the sputter etch rate created by the impinging ions is approximately three to four times higher at 45E than it is at 90E, facets 20 form at the corners of the two circuit elements 14 during the deposition process. Illustrated in drawing FIGS. 2 through 4 is the continuing growth of the layer of $SiO_2$ 16 and filling of the isolation gap 12 as would be expected from an HDP process having an optimized deposition-to-etch ratio.

However, as is well known, the deposition-to-etch ratio can be controlled by varying the rate of flow of $SiH_4$ or other process gases into the reaction chamber. For example, if the flow rate of $SiH_4$ is increased, the deposition rate of the HDP CVD process will increase. As shown in drawing FIG. 5, if the deposition-to-etch ratio is increased above the optimum, the facets 20 begin moving away from the corners of the two circuit elements 14, and cusps 22 begin to form on sidewalls 24 of the isolation gap 12. Cusp formation is believed to result from redeposition of etched $SiO_2$ on opposing surfaces through line-of-sight redeposition. Significantly, the rate of redeposition increases as the distance (represented by the letter "D") between opposing facets 20 decreases. As the facets 20 move away from the corners of the two circuit elements 14, the line-of-sight paths are shortened and sidewall 24 redeposition is increased. Eventually, the cusps 22 meet, preventing further deposition below the cusps 22 and creating a void 25 in the dielectric material layer $SiO_2$ 16 deposited within the isolation gap 12, as can be seen in drawing FIG. 6.

Additionally, if the rate at which inert gas (e.g., Ar) is introduced into an HDP CVD chamber is increased or flow of $SiH_4$ is decreased, the sputter etch rate of the HDP CVD process will increase, thereby decreasing the deposition-to-etch ratio. As shown in drawing FIG. 7, decreasing the deposition-to-etch ratio can result in the etching or "clipping" of material from the corners 23 of the two circuit elements 14. Clipping progressively damages the circuit elements as the HDP CVD process progresses and will potentially compromise the performance of the two circuit elements 14 or render the two circuit elements 14 completely inoperable.

As is easily appreciated from the foregoing, the flow rate of reactant gases used to effect HDP CVD processes, particularly those gases that affect the deposition-to-etch ratio, must be precisely controlled. This is especially true as the device features to be filled by HDP CVD processes shrink well below 0.5 μm. However, known gas delivery systems used in conjunction with HDP CVD reactors do not provide the range of control necessary to consistently deposit high quality dielectric material within the ever-shrinking, high-aspect-ratio device features included in state of the art semiconductor devices.

A typical gas distribution device 28 used for gas delivery within an HDP CVD reaction chamber is illustrated in drawing FIG. 8. Such a gas distribution device 28 includes a single mass flow control valve ("MFC") 30, a gas inlet 32, a manifold ring 34, and a plurality of nozzles 36a-36h. Often during an initial period of a "gas-on" phase of an HDP CVD process, a build up of process gas pressure occurs within the gas delivery system, and where a gas distribution device 28 such as the device illustrated in drawing FIG. 8 is used, the initial build up of process gas pressure results in a high initial flow of reactant gas through the nozzles located closest to the gas inlet 32. However, while this high flow is occurring at the nozzles 36a, 36h closest to the gas inlet 32, very little, if any, reactant gas flows through those nozzles 36d, 36e located farthest away from the gas inlet 32 for approximately one to two seconds. Thus, deposition of $SiO_2$ on the target substrate (not shown) begins in the area of the substrate underlying those nozzles 36a, 36h closest to the gas inlet 32 before any deposition has taken place in the area of the target substrate underlying those nozzles 36d, 36e located farthest from the gas inlet 32. Moreover, the initial build up of process gas pressure causes process gas to flow through those nozzles 36a, 36h closest to the gas inlet 32 at an undesirably high rate, and the deposition-to-etch ratio of the HDP CVD process moves away from the desired optimum, until the pressure of the process gas within the gas distribution device 28 stabilizes.

Where a gas delivery ring such as the one illustrated in drawing FIG. 8 is used to deliver $SiH_4$ during an HDP CVD process, the quality of the resulting dielectric material may, therefore, be severely compromised. During the initial period of an $SiH_4$ gas-on phase, the high flow of $SiH_4$ through the nozzles 36a, 36h located closest to the gas inlet 32 of the gas distribution device 28 will cause the deposition-to-etch ratio to increase away from the desired optimum. Even though this inconsistency may last as little as one second, the deposition-to-etch ratio is effected long enough to affect deposition of at least the initial nuclear layer of the deposited dielectric material in such a way as to cause voids or other material inconsistencies within the deposited dielectric layer as the deposition process continues. Thus, the inconsistent gas flow provided by known gas delivery rings often renders entire wafers or portions of wafers unusable.

As can be easily appreciated, there is a need in the art for a gas delivery apparatus that allows reliable, precise control of gas flow at all times during a material deposition process. Such a device would not only be desirable because it would eliminate the problems caused by the inconsistent delivery of process gases associated with known devices, but such a device will likely prove necessary as the dimensions of state of the art semiconductor devices continue to shrink.

BRIEF SUMMARY OF THE INVENTION

The gas delivery device of the present invention addresses the foregoing needs by enabling precise control of process gas flow into a reaction chamber. In each embodiment, the gas delivery device of the present invention includes a plurality of active diffusers and a plurality of gas delivery nozzles which extend into the reaction chamber. Before entering the reaction chamber through one of the plurality of gas delivery nozzles, process gas must first pass through one of the plurality of active diffusers. Each of the active diffusers is centrally controllable such that the rate at which process gas flows through each active diffuser is exactly controlled at all times throughout a given deposition process. As a result, the gas delivery device of the present invention not only eliminates any undesirable increase in the rate of process gas flow during the initial period of a "gas on" phase of a material deposition process, but enables exact control of the deposition-to-etch ratio of any HDP CVD process. Further, each of the plurality of active diffusers included in the gas delivery device of the present invention is specifically positioned to minimize any inconsistencies in the time needed for the process gas to flow from the plurality of active diffusers and through each nozzle of the plurality of gas delivery nozzles. Thus, the gas delivery device of the present invention prevents the formation of material voids associated with the inconsistent flow rates of process gas during material deposition processes, such as an HDP CVD process, while reducing or eliminating any problems associated with non-uniform distribution of process gas within a reaction chamber.

The present invention also includes a reaction chamber for use in material deposition processes. The reaction chamber includes a sealable chamber and a gas delivery device. The reaction chamber may further include various other known features necessary for carrying out a desired material deposition process. Significantly, because the reaction chamber incorporates the gas delivery device, the reaction chamber enables precise control of process gas dosing within the reaction chamber throughout any given material deposition process.

Furthermore, the present invention includes a method of carrying out a material deposition process. The method of the present invention includes providing a reaction chamber, providing a gas delivery device according to any one of the embodiments of the gas delivery device of the present invention, disposing a semiconductor substrate within the reaction chamber, and introducing a desired process gas into the reaction chamber using the gas delivery device of the present invention.

Various other aspects and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

The figures presented in conjunction with this description are not actual views of any particular portion of a device or component, but are merely representations employed to more clearly and fully depict the present invention.

DETAILED DESCRIPTION OF THE INVENTION

Figure 1:
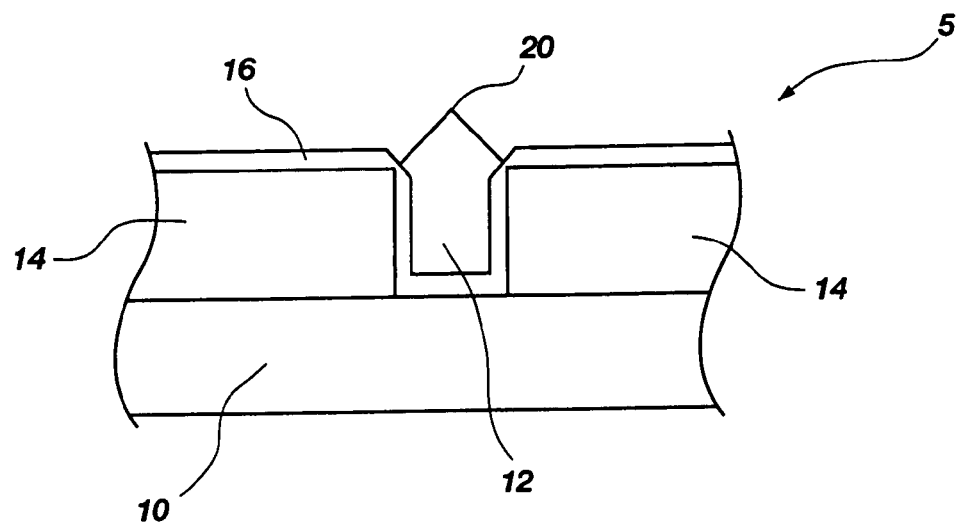
FIG. 1 through 4 illustrate deposition of a dielectric material over an intermediate semiconductor device during a desirable HDP CVD process.
Figure 2:
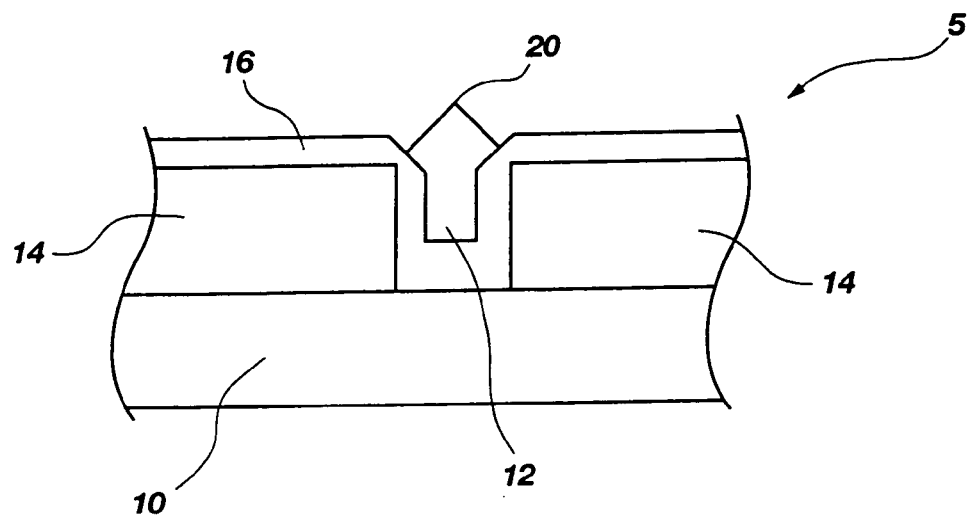
Figure 3:
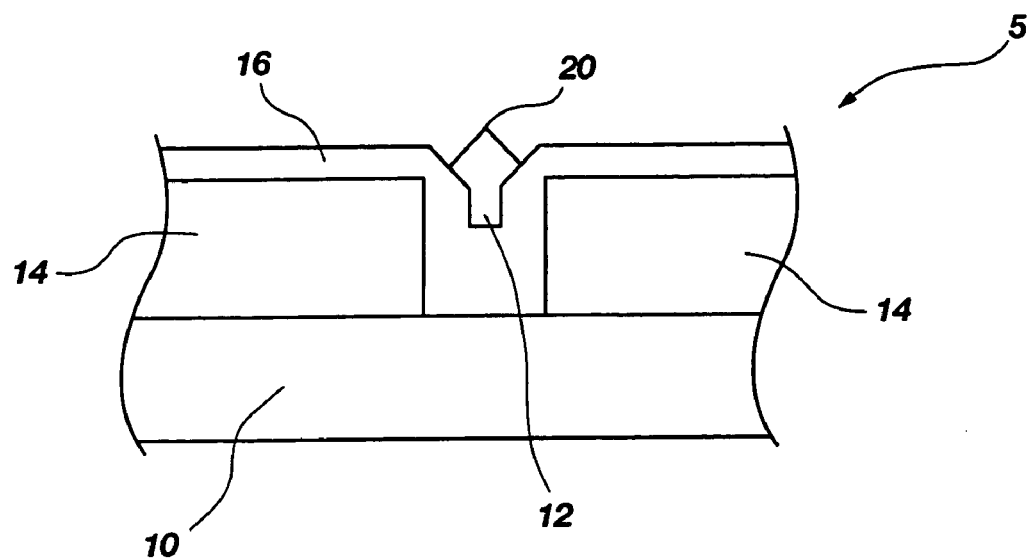
Figure 4:
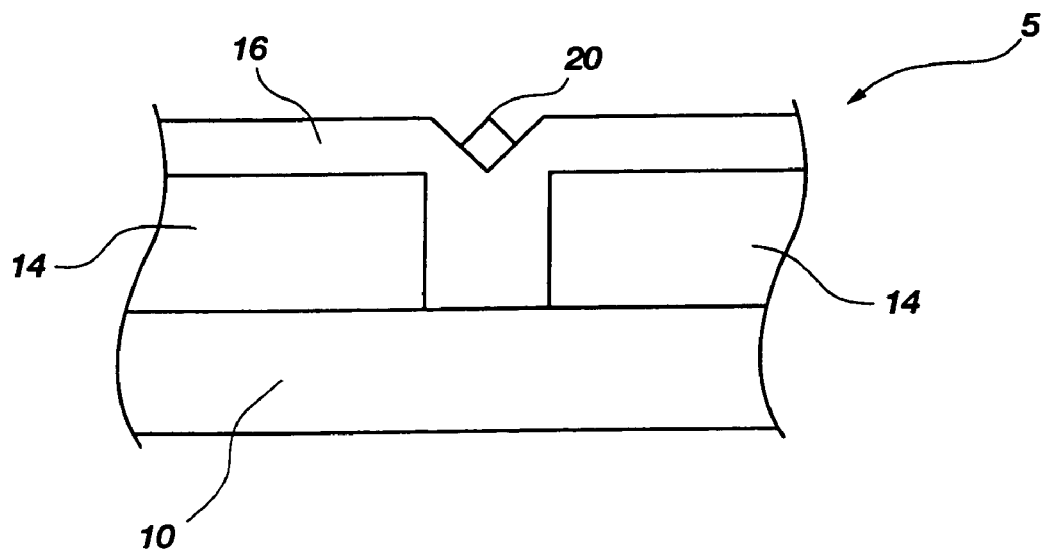
Figure 5:
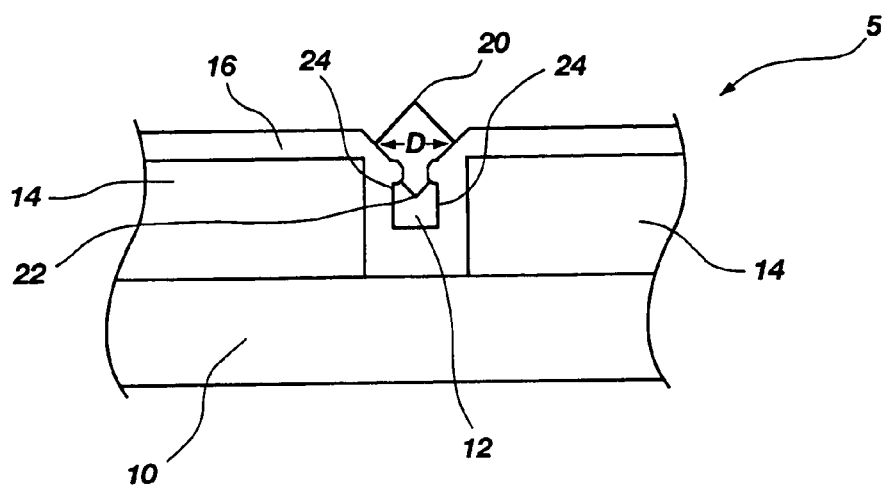
FIG. 5 and FIG. 6 illustrate the formation of a material void within a dielectric material deposited over an intermediate semiconductor device that may occur when the deposition-to-etch ratio of an HDP CVD process is increased away from an optimum value.
Figure 6:
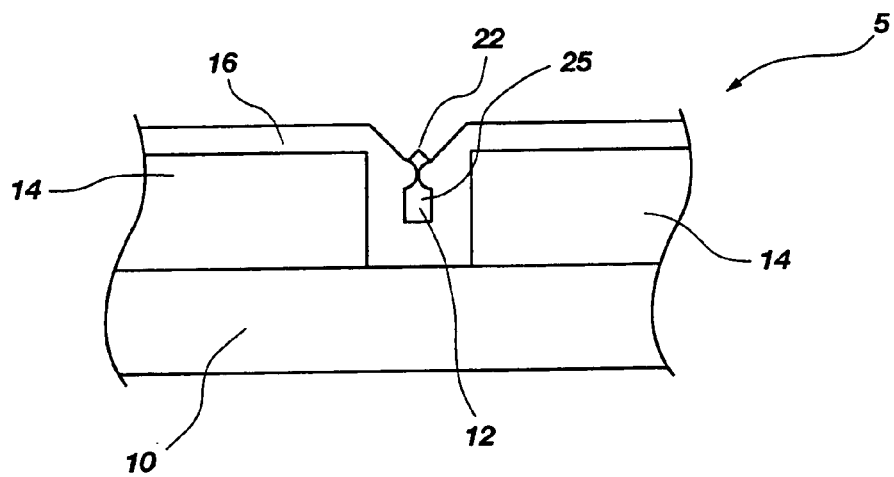
Figure 7:
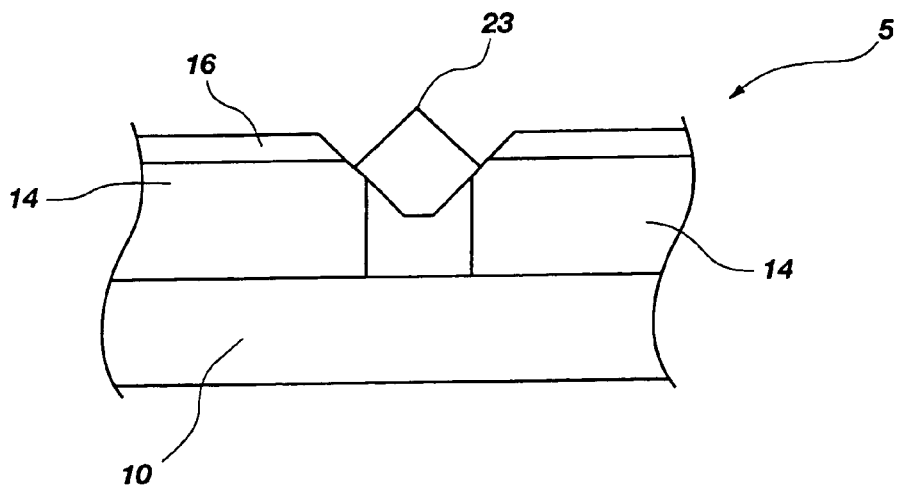
FIG. 7 illustrates the clipping of device features that may occur when the deposition-to-etch ratio of an HDP CVD process is decreased away from an optimum value.
Figure 8:
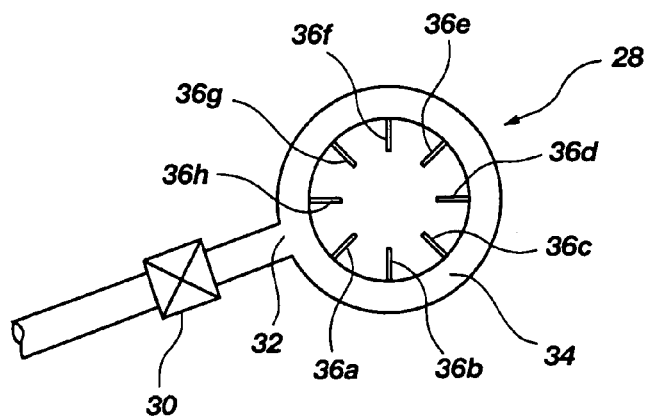
FIG. 8 schematically illustrates a gas delivery device currently used to deliver process gas within a reaction chamber used for HDP CVD.
Figure 9:
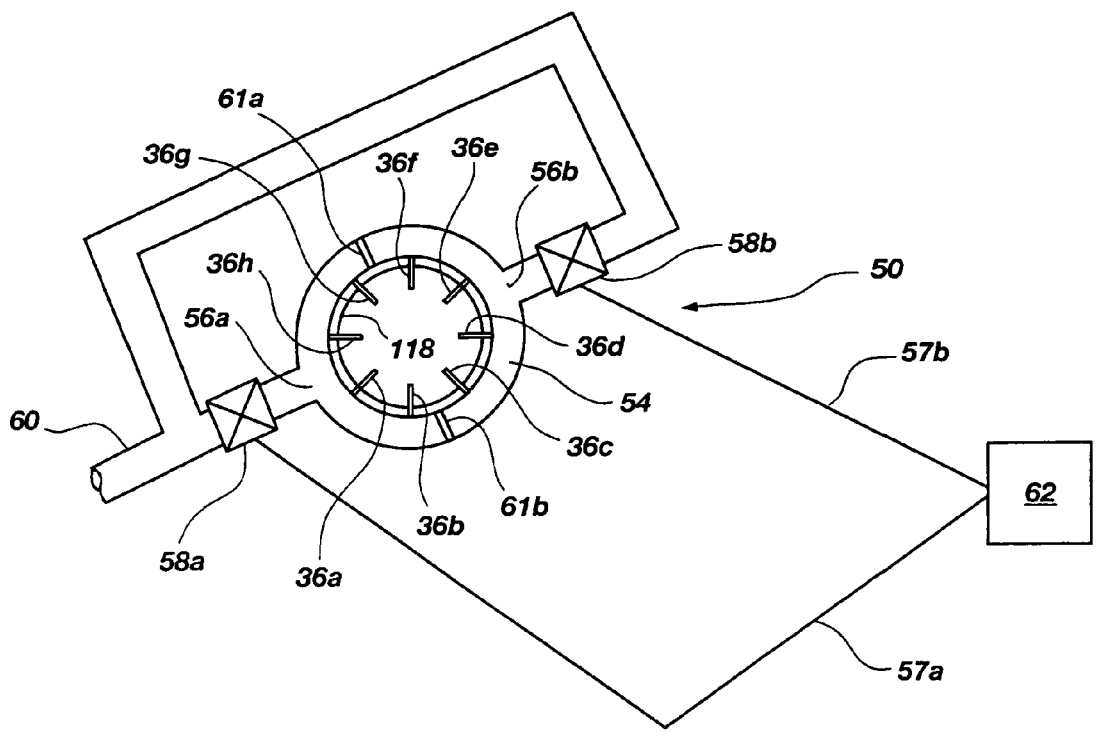
FIG. 9 schematically illustrates the first embodiment of a gas delivery device of the present invention.

A first embodiment of the gas delivery device 50 of the present invention is illustrated in drawing FIG. 9. The gas delivery device 50 of the first embodiment includes a plurality of gas delivery nozzles 36a–36h extending through the reaction chamber wall 118, a manifold 54 including gas inlets 56a, 56b, and active diffusers 58a, 58b. Process gas is delivered to each of the active diffusers 58a, 58b through a branched gas delivery line 60. As the process gas passes through the active diffusers 58a, 58b, it enters the manifold 54 through the gas inlets 56a, 56b. From the manifold 54, the process gas is delivered into a reaction chamber (not illustrated in drawing FIG. 9) through the plurality of gas delivery nozzles 36a-36h. As can also be seen in drawing FIG. 9, the active diffusers 58a, 58b are positioned relative to the manifold 54 and associated gas delivery nozzles 36a-36h such that inconsistencies in the time needed for process gas to flow from the active diffusers 58a, 58b and through each of the gas delivery nozzles 36a-36h are minimized or eliminated. Furthermore, in order to facilitate production and maintenance of a consistent process gas pressure within the manifold 54, the gas delivery device 50 according to the first embodiment may include one or more manifold partitions 61a, 61b within the manifold 54.

The operation of each of the active diffusers 58a, 58b is controlled by a central controller 62, which may include, for example, a programmable computer circuit. The central controller 62 is placed in communication with each of the active diffusers 58a, 58b using one or more suitable communication lines 57a, 57b, such as well-known electrical or optical communication lines. The central controller 62 is capable of continuously monitoring the process gas pressure within or near each of the active diffusers 58a, 58b using information provided by a pressure sensor (not illustrated in drawing FIG. 9) placed within or near each active diffuser 58a, 58b. Generally, the active diffusers 58a, 58b are controlled to prevent gas flow from the branched gas delivery line 60 and into the manifold 54 until a desired minimum process gas pressure is achieved within or near each active diffuser 58a, 58b. Once the desired minimum process gas pressure is achieved within or near each active diffuser 58a, 58b, however, the central controller 62 instructs the active diffusers 58a, 58b via communication lines 57a, 57b to operate such that a desired rate of process gas flow into the associated reaction chamber is exactly provided by each active diffuser 58a, 58b.

Because the central controller 62 is capable of continuously monitoring the process gas pressure within or near each one of the active diffusers 58a, 58b, the operation of each of the active diffusers 58a, 58b may be continually and independently adjusted to compensate for inconsistencies in process gas pressure within the branched gas delivery line 60, regardless of whether such inconsistencies are expected, as in the case of a pressure build up during the initial period of a gas-on phase, or unexpected, as may occur due to malfunction or fouling of one or more components of the gas delivery device 50. Moreover, using continuously updated pressure information, the central controller 62 can control each active diffuser 58a, 58b such that a desired process gas flow is precisely achieved through each active diffuser 58a, 58b, even if different process gas pressures are consistently created at the different active diffusers 58a, 58b.

Figure 10:
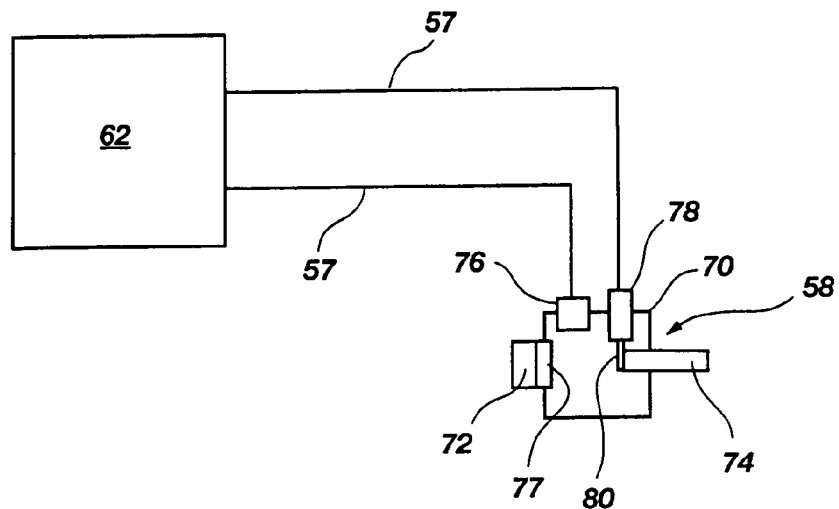
FIG. 10 and FIG. 11 schematically illustrate alternative configurations of an active diffuser that may be used in each of the embodiments of the gas delivery device of the present invention.

Illustrated in drawing FIG. 10 is an active diffuser 58 suitable for use in any one of the embodiments of the gas delivery device of the present invention. As is illustrated in drawing FIG. 10, each active diffuser 58 includes a body 70 having an inlet 72 and an outlet 74, a modulator 78, and a transducer body 80, which prevents gas flow through the outlet 74 when in a closed state, but allows gas flow through the outlet 74 when in an open state. In addition, each active diffuser 58 may optionally incorporate one or more particulate filters 77 or a pressure sensor 76. The pressure sensor 76, which may include any suitable pressure sensing technology, such as a known pressure transducer, continuously produces signals indicative of the process gas pressure within the active diffuser 58. Such signals are preferably digital signals and are readable by a central controller 62. The central controller 62 may include, for example, a programmable computer circuit (not illustrated in FIG. 10). The signals produced by the pressure sensor 76 are communicated to the central controller 62 via one or more suitable communication lines 57, such as well-known electrical or optical communication lines. Using the signals continuously produced by the pressure sensor 76, the central controller 62 directs the modulator 78 to act upon the transducer body 80 such that the transducer body 80 alternates between closed and open states at a rate that will produce a desired dosage of process gas in the context of the sensed process gas pressure. The central controller 62 is placed in communication with the modulator 78 of the active diffuser 58 and controls the modulator 78 via one or more other suitable communication lines 57 known in the art, such as known electrical or optical communication lines.

Figure 11:
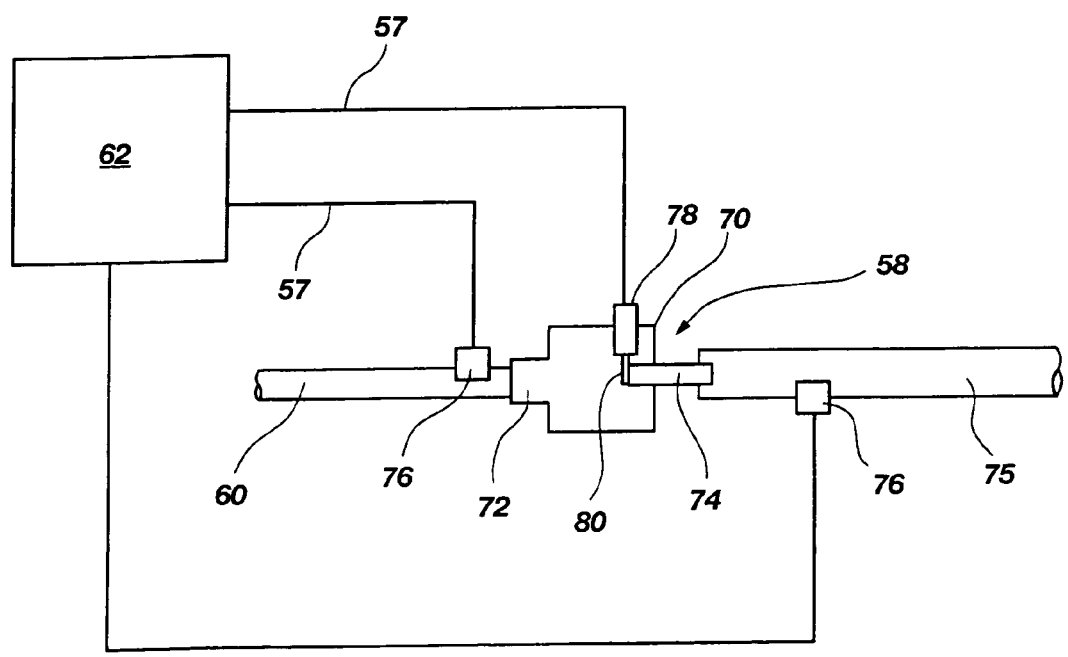

However, as is illustrated in drawing FIG. 11, an active diffuser 58 suitable for use in the various embodiments of the gas delivery device of the present invention need not incorporate a pressure sensor 76. For example, a known pressure sensor 76 may extend through a branched gas delivery line 60 near the inlet 72 of the active diffuser 58. In such an embodiment, the pressure of the process gas within the active diffuser 58 would be accurately estimated, and the function and operation of the central controller 62, the pressure sensor 76, and the active diffuser 58 remain substantially the same. That is, the pressure sensor 76 continuously produces signals indicative of the process gas pressure within the branched gas delivery line 60 near the inlet 72 of the active diffuser 58. Alternatively, a pressure sensor 76 may extend through a gas outlet line 75 near the outlet 74 of the active diffuser 58. The pressure sensor 76 placed near the outlet 74 would sense the pressure produced by the process gas exiting the active diffuser 58 and continuously produces signals indicative of the process gas pressure within the gas outlet line 75 near the outlet 74 of the active diffuser 58. If desired, pressure sensors 76 may be provided near the inlet 72 of the active diffuser 58 and a pressure sensor 76 may be provided near the outlet 74 of the active diffuser 58. Regardless of the location of the pressure sensors 76, however, the signals produced by the pressure sensors 76 are communicated to and read by the central controller 62, and using the signals continuously produced by the pressure sensors 76, the central controller 62 directs the operation of the active diffuser 58 to produce a desired dosage of process gas in light of the sensed process gas pressures.

In each of the embodiments of the gas delivery device of the present invention, at least one pressure sensor is associated with each active diffuser, as is illustrated in drawing FIG. 10 and drawing FIG. 11. Further, each pressure sensor included in each embodiment of the gas delivery device of the present invention is placed in communication with a central controller, as illustrated in drawing FIG. 10 and drawing FIG. 11. Placing at least one pressure sensor near or within each active diffuser enables accurate sensing of process gas pressure near or within each active diffuser, thereby enabling more precise control of each active diffuser and more accurate dosing of process gas within a reaction chamber.

Though any suitable active diffuser may be used in conjunction with the various embodiments of the gas delivery device of the present invention, piezoelectric gas valves are presently preferred. The transducer body of piezoelectric gas valves includes a piezoelectric element that responds to voltages applied by an electromagnetic modulator with precise movements that are directly proportional to the voltage applied. Thus, depending on the voltage applied, the piezoelectric member may be bent to varying degrees, resulting in varying "open" states of the piezoelectric valve. Moreover, the time required for the piezoelectric element to respond to an applied voltage is generally less than 2 milliseconds. As a consequence, a piezoelectric element may be cycled between closed and varying open states hundreds of times each second. These performance characteristics result in a valve that is not only easily and precisely controllable by a central controller, but which is also capable of consistently providing an extremely wide range of desired process gas flows even where the process gas supplied to such valves is provided at inconsistent or varying pressures.

Piezoelectric valves and central controllers suitable for use in the various embodiments of the gas delivery device of the present invention must provide fast response times as well as reliable operation over time, and such devices are known in the art. For example, Engineering Measurements Company ("EMCO") produces piezoelectric valves and associated control systems that provide desirable response times and long-term reliability. The piezoelectric valves and control systems produced by EMCO may be used as the active diffusers and central controller associated with each embodiment of the gas delivery device of the present invention.

Figure 12:
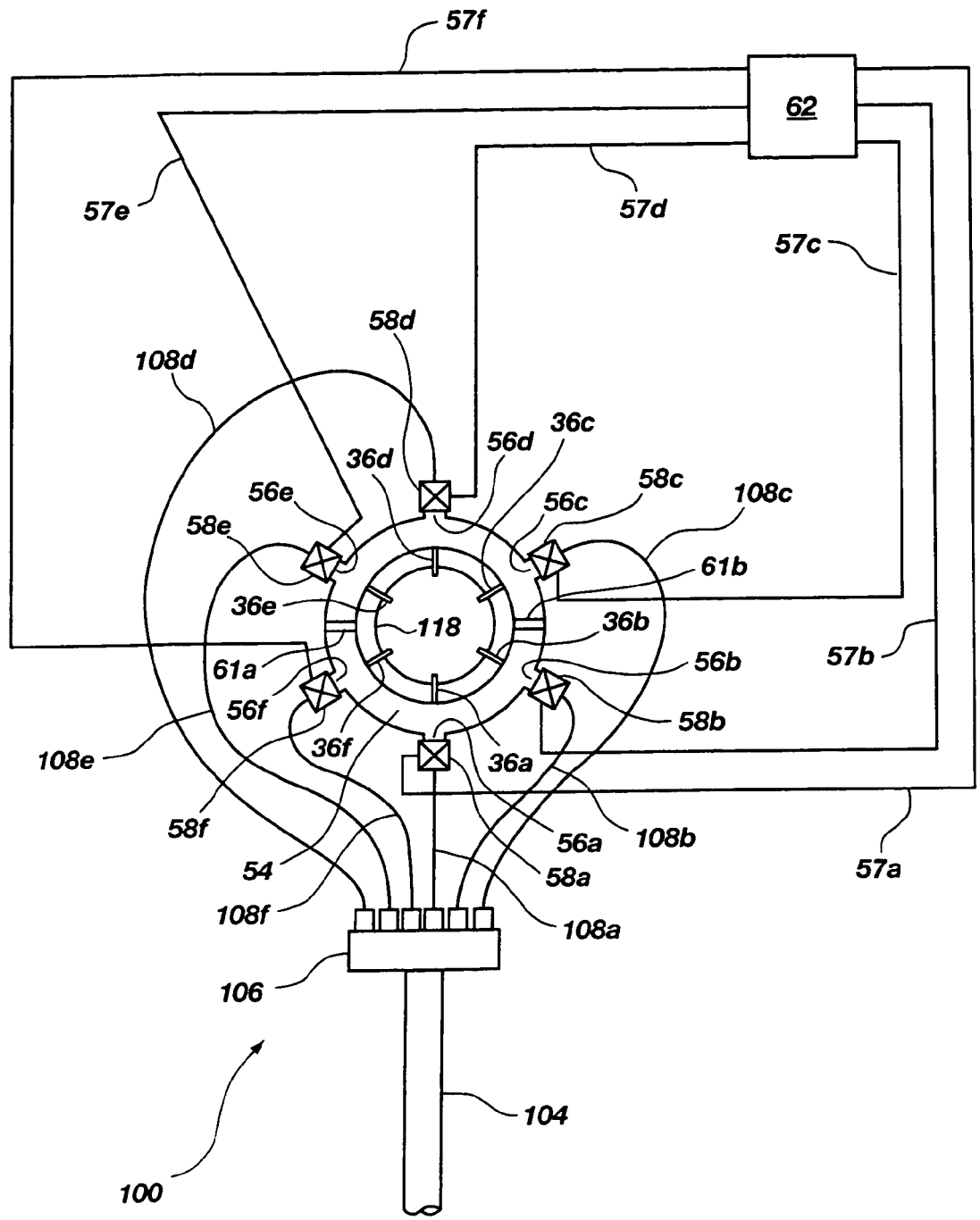
FIG. 12 through 16 schematically illustrate further embodiments of the gas delivery device of the present invention.

A second embodiment of the gas delivery device of the present invention is illustrated in drawing FIG. 12. Like the first embodiment illustrated in drawing FIG. 9, the second embodiment of the gas delivery device 100 of the present invention includes a plurality of gas delivery nozzles 36a-36f which extend through the reaction chamber wall 118, a manifold 54 having a plurality of gas inlets 56a-56f, and a plurality of active diffusers 58a-58f, which are placed in communication with a central controller 62 using known communication lines 57a-57f, such as known electrical or optical communication lines. As is true of the active diffusers 58a and 58b depicted in the first embodiment, the active diffusers 58a-58f of the second embodiment are controlled via communication lines 57a-57f by a central controller 62, which may include, for example, a programmable computer circuit. Moreover, the gas delivery device according to the second embodiment may include one or more manifold partitions 61a, 61b that facilitate production and maintenance of a consistent process gas pressure within the manifold 54. However, the gas delivery device 100 according to the second embodiment includes active diffusers 58a-58f and gas inlets 56a-56f corresponding to each gas delivery nozzle 36a-36f. Such a design substantially eliminates any inconsistencies in the time required for process gas to travel from the active diffusers 58a-58f and through each of the gas delivery nozzles 36a-36f, further assuring consistent delivery of process gas into the reaction chamber throughout a deposition process.

Additionally, the gas delivery device 100 of the second embodiment includes a primary gas delivery line 104, a plenum 106, and secondary gas delivery lines 108a-108f, each servicing one of the plurality of active diffusers 58a-58f. Preferably, each of the secondary gas delivery lines 108a-108f is exactly the same length, thereby creating a process gas distribution system wherein the process gas travels exactly the same distance before arriving at each of the active diffusers 58a-58f. Where the process gas delivered to each of the active diffusers must travel exactly the same distance, equilibration of process gas pressure at each of the active diffusers becomes less difficult.

Of course, each of the embodiments already described may be modified in harmony with the present invention. For example, a gas delivery device of the present invention may include any desirable number of primary and secondary gas delivery lines, plenums, active diffusers, communication lines, gas inlets, and gas delivery nozzles, or the gas delivery device of the present invention may include more than one manifold.

Figure 13:
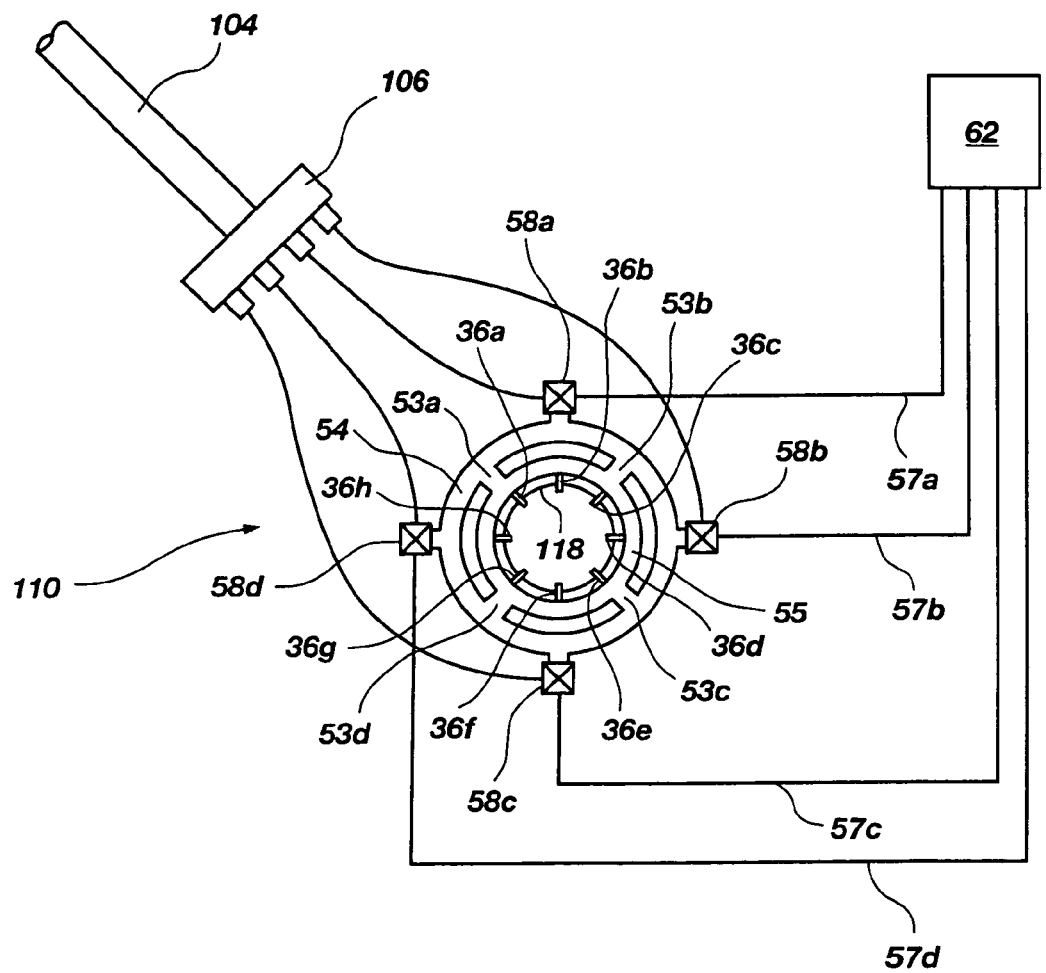

Illustrated in FIG. 13 is a third embodiment of the gas delivery device 110 of the present invention, which includes a plurality of active diffusers 58a-58d controlled by a central controller 62 via suitable communication lines 57a-57d, such as known electrical or optical communication lines, as well as a first manifold 54, a plurality of gas delivery nozzles 36a-36h, which extend through a reaction chamber wall 118 and are associated with a second manifold 55, and a plurality of gas passageways 53a-53d associated with the first and second manifolds 54, 55, respectively. The gas delivery device 110 illustrated in drawing FIG. 13 helps ensure that the process gas leaving each of the active diffusers 58a-58d arrives at and passes through each of the gas delivery nozzles 36a-36h at the same time and under the same pressure, particularly where the ratio of active diffusers 58a-58d to gas delivery nozzles 36a-36h included in a gas delivery device of the present invention, is less than one.

Alternatively, the gas delivery device of the present invention need not include a manifold at all. In a fourth embodiment of the gas delivery device 112 of the present invention (illustrated in drawing FIG. 14), the gas delivery device 112 includes a primary gas delivery line 104, a plenum 106, and secondary gas delivery lines 108a-108d, each servicing one of a plurality of active diffusers 58a-58d, with each of the active diffusers 58a-58d being placed in communication with and controlled by a central controller 62 via suitable communication lines 57a-57d, such as known electrical or optical communication lines. The gas delivery device 112 according to the fourth embodiment also includes a plurality of tertiary gas lines 114a-114h extending between the active diffusers 58a-58d and a plurality of gas delivery nozzles 36a-36h which extend through the reaction chamber wall 118. Preferably, each of the secondary gas delivery lines 108a-108d are of equal length and each of the tertiary gas lines 114a-114h are also of equal length, thereby creating a process gas distribution system wherein the process gas travels exactly the same distance before arriving at each of the gas delivery nozzles 36a–36h.

Figure 14:
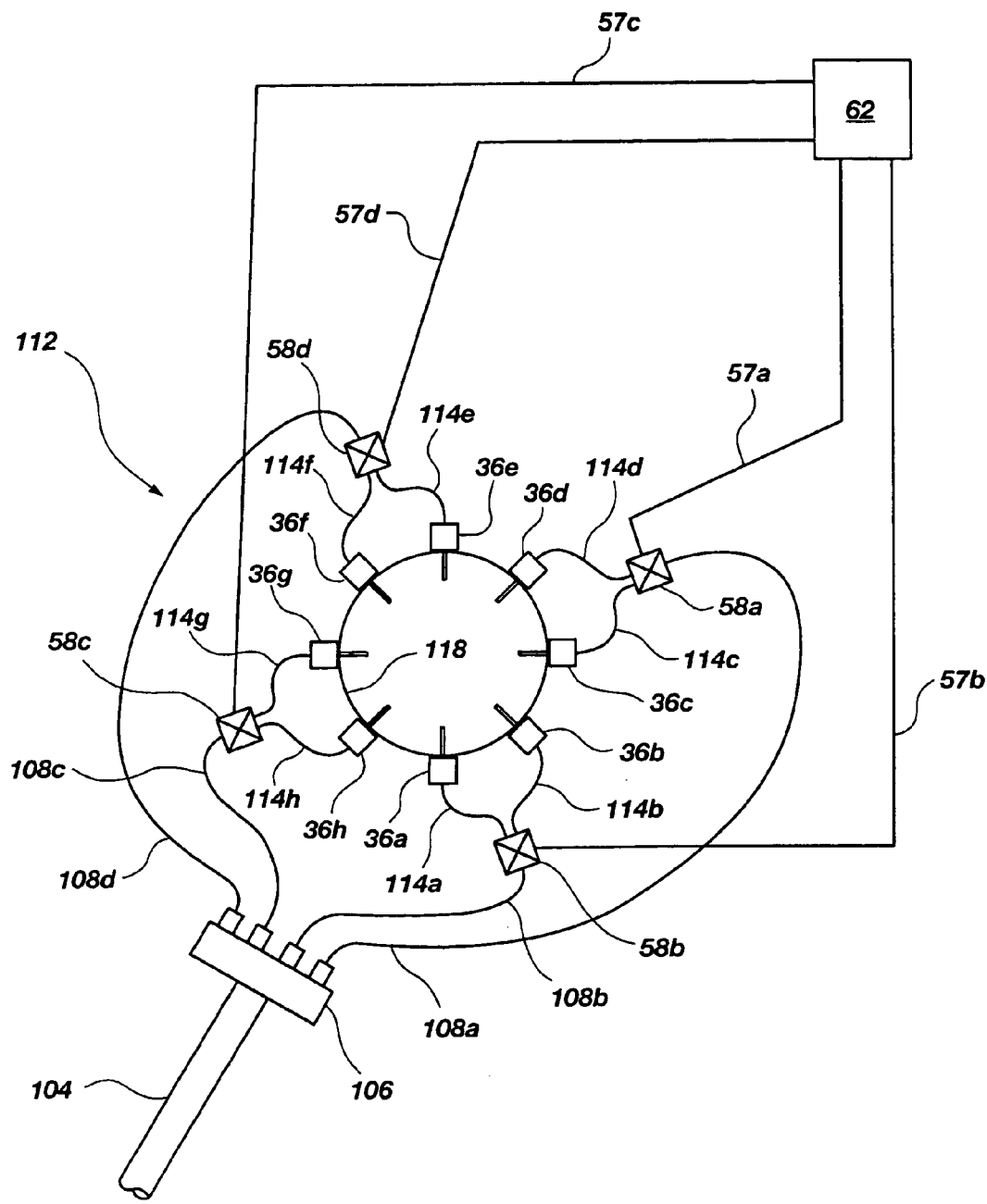

As is easily appreciated from drawing FIG. 14, upon passing through each of the active diffusers 58a–58d, process gas does not enter a manifold to be distributed to each of the gas delivery nozzles 36a–36h. Instead, process gas passes directly from each active diffuser 58a–58d to an associated gas delivery nozzle 36a–36h through one of the tertiary gas lines 114a–114h. Such a design eliminates potential complications associated with the use of one or more manifolds, such as inconsistent process gas pressures within the manifold or inconsistencies in the time required by the process gas exiting the active diffusers 58a–58d to reach each of the gas delivery nozzles 36a–36h.

Figure 15:
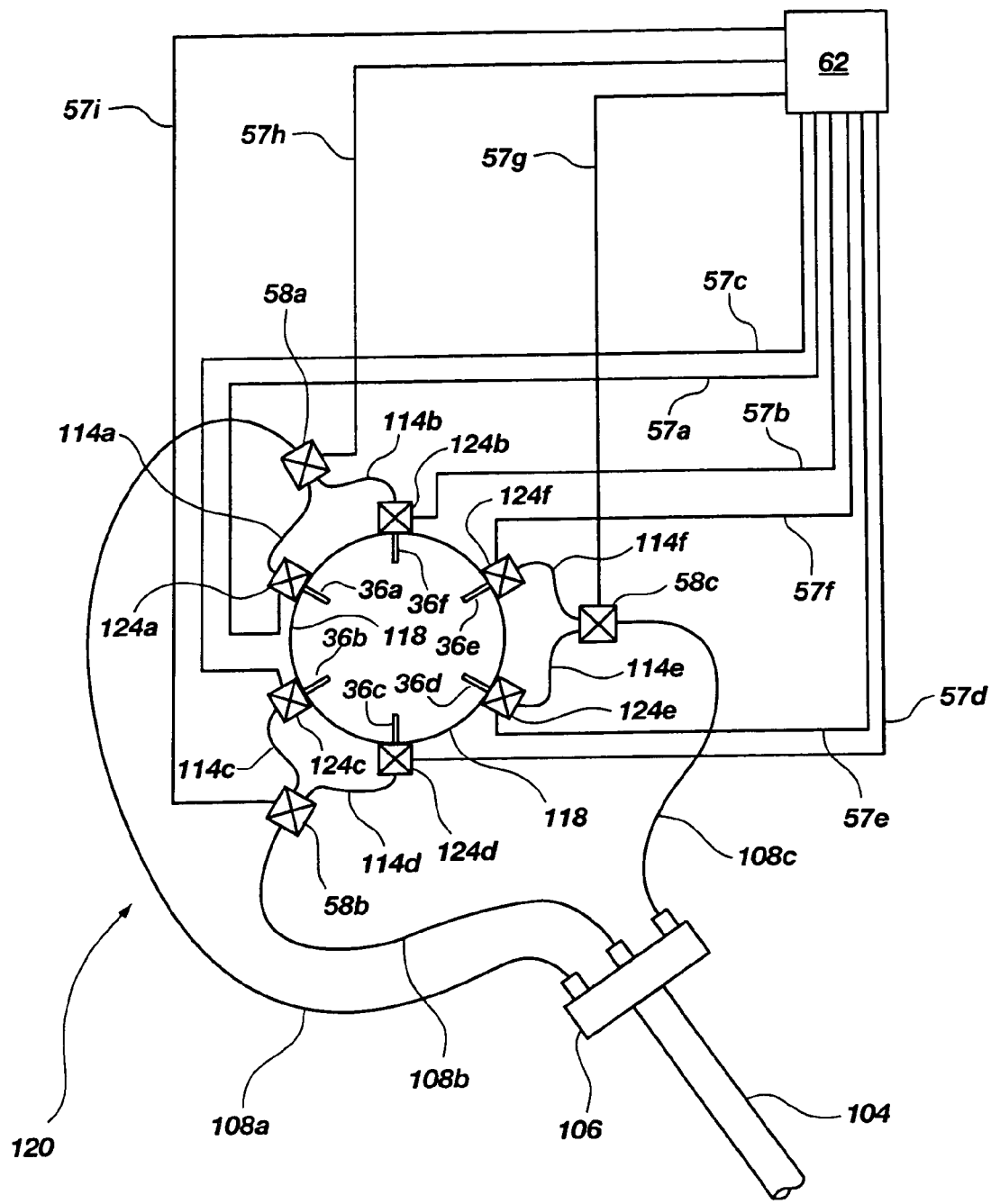

A fifth embodiment of the gas delivery device 120 of the present invention is illustrated in drawing FIG. 15. The fifth embodiment of the gas delivery device 120 is similar to the fourth embodiment, in that the fifth embodiment includes a primary gas delivery line 104, a plenum 106, secondary gas delivery lines 108a–108c, tertiary gas lines 114a–114f, and a plurality of gas delivery nozzles 36a–36f extending through the reaction chamber wall 118. However, the fifth embodiment differs from the fourth embodiment, in that the active diffusers of the fifth embodiment are divided into a first plurality of active diffusers 58a–58c as well as a second plurality of active diffusers 124a–124f. Each of the secondary gas delivery lines 108a–108c extends between the plenum 106 and one of the first plurality of active diffusers 58a–58c, and each of the tertiary gas lines 114a–114f extends from one of the first plurality of active diffusers 58a–58c to one of the second plurality of active diffusers 124a–124f. Thus, before entering the reaction chamber, process gas passes from the primary gas delivery line 104, through the plenum 106, the secondary gas delivery lines 108a–108c, the first plurality of active diffusers 58a–58c, the tertiary gas lines 114a–114f, and the second plurality of active diffusers 124a–124f.

As is true of the previously described embodiments, the first plurality of active diffusers 58a-58c, 124a-124f, respectively, included in the fifth embodiment of the gas delivery device of the present invention are placed in communication with the central controller 62 using suitable communication lines 57a-57i, such as known electrical or optical communication lines, and each of the active diffusers 58a-58c, 124a-124f, respectively, is operated under the direction of a central controller 62 via the communication lines 57a-57i. However, because the fifth embodiment includes first and second pluralities of active diffusers 58a-58c, 124a-124f, respectively, the central controller 62 associated with the fifth embodiment may be programmed to monitor and control the first and second pluralities of active diffusers 58a-58c, 124a-124f to provide various performance advantages relative to those embodiments already described.

For example, the first and second plurality of active diffusers 58a-58c, 124a-124f, respectively, of the fifth embodiment may be controlled by the central controller 62 to provide a redundant gas delivery system. To provide a redundant gas delivery system, the central controller 62 monitors and controls the first plurality of active diffusers 58a-58c independently of the second plurality of active diffusers 124a-124f. Both the first plurality 58a-58c and the second plurality of active diffusers 124a-124f of the active diffusers are controlled by the central controller 62 to provide the rate of process gas flow desired for a particular deposition process. For example, during an initial period of a gas-on phase of a deposition process, the first plurality of active diffusers 58a-58c and the second plurality of active diffusers 124a-124f may remain in a closed state. As process gas flows into the secondary gas delivery lines 108a-108c and a desired minimum process gas pressure is achieved near or within each of the first plurality of active diffusers 58a-58c, the first plurality of active diffusers 58a-58c are then controlled by the central controller 62 to provide the desired process gas flow rate as if the process gas was passing directly from the first plurality of active diffusers 58a-58c, through the gas delivery nozzles 36a-36f and into the reaction chamber, not into the tertiary gas lines 114a-114f. As process gas flows from each of the first plurality of active diffusers 58a-58c and into the tertiary gas lines 114a-114f, the second plurality of active diffusers 124a-124f may remain in a closed state until a desired process gas pressure is achieved within or near each of the second plurality of active diffusers 124a-124f. At that time, the central controller 62 controls each of the second plurality of active diffusers 124a-124f to again provide the desired flow of process gas through each of the gas delivery nozzles 36a-36f and into the reaction chamber. The redundancy of such a system allows for some malfunction or error in the operation of one or more of the active diffusers included in the first and second pluralities of active diffusers 58a-58c, 124a-124f, respectively, without compromising the desired process gas flow rate into the reaction chamber.

Figure 16:
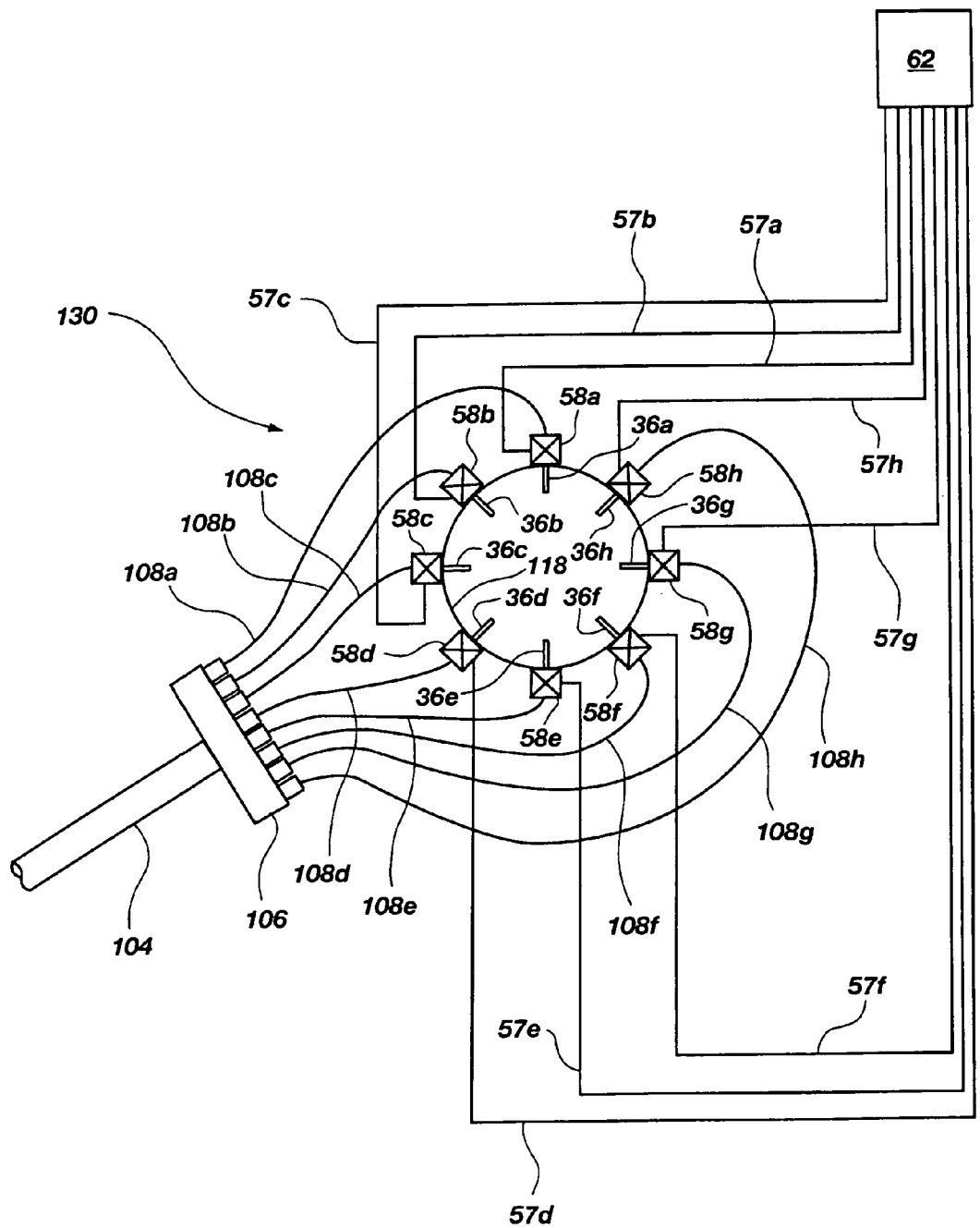

However, where the gas delivery device of the present invention does not include a manifold, the gas delivery system need not include tertiary gas lines. As can be seen in a sixth embodiment of the gas delivery device 130 of the present invention (illustrated in FIG. 16), the gas delivery device 130 of the present invention may only include a primary gas delivery line 104, a plenum 106, secondary gas delivery lines 108a–108h, and a plurality of active diffusers 58a–58h associated with a plurality of gas delivery nozzles 36a–36h, which extend through a reaction chamber wall 118. Such a design avoids the potential problems associated with a gas delivery device incorporating one or more manifolds and is simpler in construction and operation than the gas delivery devices of the fourth and fifth embodiments.

Again, the embodiments of the gas delivery device of the present invention described herein are provided for illustrative purposes only. The gas delivery device of the present invention may include any desirable number of gas delivery lines, plenums, active diffusers, gas delivery nozzles, communication lines, pressure sensors, manifolds, etc. The design of the gas delivery device of the present invention is extremely flexible and may be easily adapted by those of ordinary skill in the art to optimize process gas delivery within any desired reaction chamber.

In each of its embodiments, however, the gas delivery device of the present invention provides significant advantages relative to those gas delivery devices currently in use in CVD deposition processes. First, due to the plurality of centrally-controlled active diffusers incorporated into each of the various embodiments, the gas delivery device of the present invention provides precise control of process gas flow within any given reaction chamber, even where inconsistent process gas pressures are experienced throughout the deposition process. Moreover, the gas delivery device alleviates or completely eliminates problems resulting from inconsistencies in the time required by process gas to reach and flow through the various gas delivery nozzles extending into a reaction chamber. Thus, the gas delivery device of the present invention provides the control necessary to enable reliable deposition of high-quality material layers within state of the art semiconductor device features having high-aspect ratios and opening widths measuring much less than 0.5 Φm.

In addition, the gas delivery devices of the present invention enable the detection of line blockages or other malfunctions that occasionally occur within a gas delivery system. For example, the inside diameter of the gas delivery nozzles currently used to deliver process gas in reaction chambers is exceedingly small, and the nozzles are easily blocked, either partially or completely, by small contaminants that may be present in the process gas, or, alternatively, gas lines leading to the gas delivery nozzles may also be progressively fouled or unexpectedly blocked. Such blockages or fouling often result in back pressures, and, particularly where no manifold is included in the gas delivery device of the present invention, such back pressures will inhibit process gas from flowing through the active diffusers as expected. As process gas is inhibited from flowing from the active diffusers, the process gas pressure in the gas line preceding the active diffuser will unexpectedly build. Such an unexpected increase in pressure would be sensed by the pressure sensor incorporated in or located near the active diffuser, and the central controller may be programmed to detect such unexpected pressure changes so that any damage to the system or to the semiconductor materials being processed may be avoided or minimized. Further, the central controller associated with each embodiment of the gas delivery device of the present invention may also be programmed to detect significant decreases in process gas pressure that may occur due to a rupture, fouling, or a blockage that occurs in a gas line preceding an active diffuser.

Figure 17:
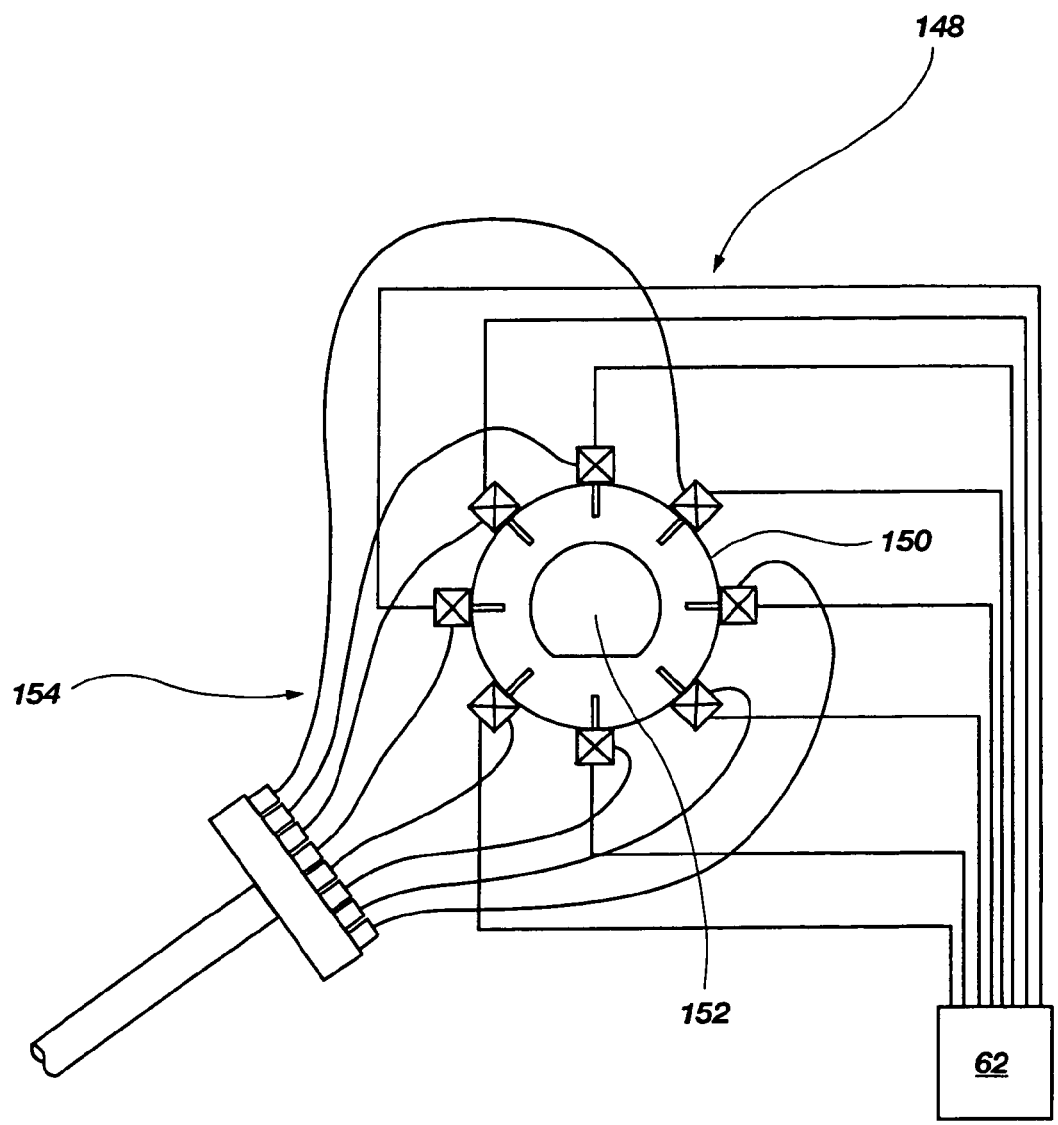
FIG. 17 provides a schematic illustration of a reaction chamber of the present invention.

Also included within the scope of the present invention is a CVD chamber, a cross section of which is schematically illustrated in drawing FIG. 17. The CVD chamber 148 according to the present invention includes a sealable chamber 150 that may be used to enclose one or more semiconductor wafers 152. Such sealable chambers are well known in the art. Moreover, the CVD chamber 148 of the present invention may also include various other known features necessary to carry out any desirable CVD process, such as an RF source, a heating apparatus, one or more ventilation systems, or substrate handling equipment, all of which are well known in the art. However, unlike known CVD chambers, the CVD chamber 148 of the present invention also includes a gas delivery device 154 of the present invention. Though the CVD chamber 148 illustrated in drawing FIG. 17 incorporates a gas delivery device 154 according to the sixth embodiment (FIG. 16) of the gas delivery device of the present invention, the CVD chamber 148 of the present invention may incorporate any embodiment of the gas delivery device of the present invention.

The present invention also includes a method of carrying out a CVD process. The method of the present invention includes providing a CVD chamber, providing a gas delivery device according to any one of the embodiments of the gas delivery device of the present invention, disposing a semiconductor substrate within the HDP CVD chamber, and introducing any suitable process gas, such as $SiH_4$, an inert gas, an oxygen-containing gas, or a nitrogen containing gas, into the CVD chamber using the gas delivery device of the present invention. The method of the present invention is extremely flexible and is easily adapted for use in any desired CVD process, such as TE CVD, PE CVD, or HDP CVD processes.

Again, although various embodiments of the gas delivery device, the reaction chamber and the method of carrying out a CVD process of the present invention are described and illustrated herein, the present invention is not so limited. As is easily appreciated by the description provided herein, the gas delivery device, the reaction chamber, and the method of carrying out a CVD process of the present invention are each highly flexible, and the various embodiments described herein may be easily modified in harmony with the present invention in order to suit a particular process need. Therefore, the gas delivery device, the reaction chamber, and the method of carrying out a CVD process of the present invention may be designed for use in any desirable CVD process, such as TE CVD, PE CVD, or HDP CVD processes, and the scope of these various aspects of the present invention is defined by the appended claims.

What is claimed is:

1. A method for depositing a material over a semiconductor substrate, comprising:
   using a reaction chamber;
   using a gas delivery device comprising a gas delivery system, a plurality of gas delivery nozzles extending into the reaction chamber, and a plurality of active diffusers, each active diffuser of the plurality of active diffusers being independently controllable from each other by a central controller to provide a desired amount of process gas flow from the gas delivery system, through the plurality of gas delivery nozzles, and into the reaction chamber;
   placing the semiconductor substrate within the reaction chamber; and
   introducing process gas within the reaction chamber via the gas delivery device.

2. A method for depositing a material over a semiconductor substrate in a reaction chamber, comprising:
   connecting a gas delivery device to the reaction chamber, the gas delivery device comprising a gas delivery system, a plurality of gas delivery nozzles extending into the reaction chamber, and a plurality of active diffusers, each active diffuser of the plurality of active diffusers being independently controllable from another active diffuser by a central controller to provide a desired amount of process gas flow from the gas delivery system, through the plurality of gas delivery and the reaction chamber;
   placing the semiconductor substrate within the reaction chamber; and
   introducing process gas within the reaction chamber via the gas delivery device.

3. A method for a semiconductor substrate using a reaction chamber, comprising:
   connecting a gas delivery device to the reaction chamber, the gas delivery device comprising a gas delivery system, a plurality of gas delivery nozzles extending into the reaction chamber, and a plurality of active diffusers, each active diffuser of the plurality of active diffusers being independently controllable from another active diffuser by a central controller to provide a desired amount of process gas flow from the gas delivery system, through the plurality of gas delivery nozzles, and into the reaction chamber;
   placing the semiconductor substrate within the reaction chamber; and
   introducing process gas within the reaction chamber via the gas delivery device.

4. A method for a semiconductor substrate comprising:
   connecting a gas delivery device to a reaction chamber, the gas delivery device comprising a gas delivery system, a plurality of gas delivery nozzles extending into the reaction chamber, and a plurality of active diffusers, each active diffuser of the plurality of active diffusers being independently controllable from another active diffuser connected to the gas delivery system by a central controller to provide a desired amount of process gas flow from the gas delivery system, through the plurality of gas delivery nozzles, and into the reaction chamber;

placing the semiconductor substrate within the reaction chamber; and introducing process gas within the reaction chamber via the gas delivery device.

5. A process for a semiconductor substrate comprising:

connecting a gas delivery device to a reaction chamber, the gas delivery device comprising a gas delivery system, a plurality of gas delivery nozzles extending into the reaction chamber, and a plurality of active diffusers, each active diffuser of the plurality of active diffusers being independently controllable from another active diffuser in the gas delivery system by a central controller to provide a desired amount of process gas flow from the gas delivery system, through the plurality of gas delivery nozzles, and into the reaction chamber;

placing the semiconductor substrate within the reaction chamber; and introducing process gas within the reaction chamber via the gas delivery device.

6. A process for a substrate comprising:

connecting a gas delivery device to a reaction chamber, the gas delivery device comprising a gas delivery system, a plurality of gas delivery nozzles extending into the reaction chamber, and a plurality of active diffusers, each active diffuser of the plurality of active diffusers being independently controllable from any diffuser in the gas delivery system by a central controller to provide a desired amount of process gas flow from the gas delivery system, through the plurality of gas delivery nozzles, and into the reaction chamber;

placing the substrate within the reaction chamber; and introducing process gas within the reaction chamber via the gas delivery device.

* * * * *

UNITED STATES PATENT AND TRADEMARK OFFICE
CERTIFICATE OF CORRECTION

PATENT NO. : 7,271,096 B2
APPLICATION NO. : 11/004702
DATED : September 18, 2007
INVENTOR(S) : Sandhu It is certified that error appears in the above-identified patent and that said Letters Patent is hereby corrected as shown below:

In column 12, line 41, in Claim 2, after "delivery" insert -- nozzles, --.

In column 12, line 42, in Claim 2, after "and" insert -- into --.

In column 12, line 55, in Claim 3, delete "another" and insert -- any other --, therefor.

Signed and Sealed this

Fourth Day of December, 2007

JON W. DUDAS
*Director of the United States Patent and Trademark Office*